United States Patent [19]

Felten

[11] 3,877,950

[45] Apr. 15, 1975

[54] PHOTOSENSITIVE GOLD COMPOSITIONS

[75] Inventor: John James Felten, Newark, Del.

[73] Assignee: E. I. du Pont de Nemours and Company, Wilmington, Del.

[22] Filed: Mar. 21, 1974

[21] Appl. No.: 453,341

[52] U.S. Cl. .................... 96/115 R; 96/34; 96/36.2; 96/38.4; 204/159.16; 204/159.22; 117/212

[51] Int. Cl. .............................................. G03c 1/58

[58] Field of Search ....... 96/115 R, 115 P, 34, 36.2, 96/38.4; 204/159.16, 159.22; 117/212

[56] References Cited

UNITED STATES PATENTS

| | | | |
|---|---|---|---|
| 2,914,404 | 11/1959 | Franselaw et al. | 96/36.2 |
| 3,222,173 | 12/1965 | Belko,Jr. et al. | 96/36.2 |
| 3,443,944 | 5/1969 | Wise | 96/38.4 |
| 3,573,908 | 4/1971 | Minette | 96/34 |
| 3,615,457 | 10/1971 | Belko, Jr. et al. | 96/34 |

FOREIGN PATENTS OR APPLICATIONS

| | | | |
|---|---|---|---|
| 1,256,344 | 12/1971 | United Kingdom | 96/34 |

*Primary Examiner*—Norman G. Torchin
*Assistant Examiner*—J. P. Brammer

[57] ABSTRACT

A photopolymerizable gold composition comprising finely divided gold and an inorganic binder therefor in a vehicle comprising certain methacrylate polymers and solvent therefor, di-, tri- or tetra-ethyleneglycol-diacrylate monomer and a photoinitiator therefor, and optionally an organometallic compound of Hf, Zr, Ti or P. This provides a printable paste composition compatible with thick-film techniques used for fabricating electrically conductive patterns and layers on substances for electronic circuits.

32 Claims, No Drawings

PHOTOSENSITIVE GOLD COMPOSITIONS

BACKGROUND OF THE INVENTION

This invention relates to photosensitive compositions containing dispersed inorganic particulate material and particularly relates to photopolymerizable compositions containing such particulate matter. More particularly, it relates to gold photopolymerizable paste compositions suitable for screen printing and firing using thick-film techniques.

Compositions containing finely divided noble metal or dielectric inorganic particulate material are well known for use in the art of preparing conductor and dielectric patterns or layers on substrates. Similarly, photoresist compositions are well known in the art for producing resist patterns on substrates and subsequent treatment of the substrate in the areas which have been imagewise exposed and developed. U.S. Pat. No. 3,573,908 discloses a process for the preparation of a ceramic substrate glaze using a mixture of a photoresist, a multicomponent oxide glaze frit, and a solvent. British Pat. No. 1,256,344 discloses applying a combination of a particulate metal, glass binder, photosensitive material, and solvent on the surface of the substrate and drying, exposing and developing it. The pattern provided is then fired to produce a printed circuit.

Prior art photosensitive compositions containing inorganic particulate material have not found acceptance in the electronic industry for fabricating electronic circuits, since they are often not readily compatible with either thin film or thick film techniques commonly employed for that purpose. Where such compositions have been found compatible with such techniques, other problems have arisen. Often polymerization during exposure has not been uniform; also, resistance to solvents during development has not been sufficient, resulting in uneven developed patterns and sometimes breaks in pattern lines. Further, upon firing, especially of thick patterns (e.g., 0.4 mil), insufficient adhesion to the substrate has often resulted in pattern lift-off from the substrate (curling). In any event, compositions capable of fine line resolution and increased conductivity are desired, especially one affording ease of processing by being developable by solvent sprays, yet thick and hence capable of carrying higher electrical currents.

It is most desirable from a practical point of view that such compositions be capable of development using high-pressure spray equipment (as opposed to gentle sprays and gentle agitation in a solvent bath), without suffering degradation of the image.

SUMMARY OF THE INVENTION

The compositions of the present invention comprise inorganic powders dispersed in a vehicle, and may be printed on substrates, selectively exposed (using conventional masking techniques) to a light source, developed using solvents (by removal of unexposed areas to leave the desired pattern), dried to remove volatile materials, and fired or sintered to coalesce the inorganic particles into a desired electronic function. With these compositions gold patterns can be generated having superior resolution, resulting from improved adhesion and solvent resistance during development (e.g., with a spray). By solvent resistance during development, it is meant that the unexposed portions are more easily and fully cleaned out, yet the exposed portions remain well defined, that is, they exhibit minimal erosion. In addition, thicker patterns with higher current carrying capability can be made. Such compositions provide greater line accuracy and resolution, which are limited in screen or stencil printing processes.

This invention is a gold conductor composition comprising finely divided gold and an inorganic binder therefor dispersed in a photosensitive vehicle, said vehicle comprising, by weight a. 15–45 parts of a polymer having an inherent viscosity, in chloroform at 25°C., in the range of 0.15 to 0.95, said polymer being selected from the class consisting of polymethylmethacrylate, polyethylmethacrylate, and mixtures thereof, b. 55–85 parts of a solvent for polymer (a), said solvent being selected from the class consisting of dihydroterpineol, benzyl alcohol, tetralin, and mixtures thereof, c. a monomer selected from the class consisting of di-, tri-, and tetra-ethyleneglycoldiacrylate and mixtures thereof, the weight of monomer (c) being 3–20% of the total weight of polymer (a) plus solvent (b).

d. a photoinitiator for monomer (c) in an amount effective to initiate polymerization thereof.

When gold compositions are referred to herein, compositions which are predominately gold, but may comprise other noble metals such as platinum or palladium (as mixtures or alloys with gold) are intended.

Where relatively thick films are to be printed the photosensitive vehicle in said gold composition additionally comprises (e) an organometallic compound of a metal selected from the class consisting of Hf, Zr, Ti, P and mixtures thereof. In the gold compositions the amount of (e) is preferably such that the weight ratio of metal in organometallic compound (e) to photoinitiator (d) is in the range of 1/10 to 1/2.5; the optimun ratio is in the range 1/8.3 to 1/4.

Where solvent (b) is dihydroterpineol, benzyl alcohol, or a mixture thereof, said vehicle may additionally comprise 1–12 parts of polymeric rheology modifier selected from the class consisting of ethylcellulose and polybutylmethacrylate.

Preferred gold compositions are those wherein the vehicle comprises 20–35 parts polymer (a), 65–80 parts solvent (b) and an amount of monomer (c) equal to 4–16% of the total weight of polymer (a) plus solvent (b). It is preferred that polymer (a) have an inherent viscosity, in chloroform at 25°C., in the range 0.15 to 0.5, and that the weight of photoinitiator (d) be about 5–50% of the weight of monomer (c).

In the gold composition it is preferred that the weight of gold plus inorganic binder be 70–90% of the composition and the photosensitive vehicle 10–30% thereof, and more preferred that the gold plus inorganic binder comprise 75–85% and the vehicle 15–25%. It is further preferred that the inorganic binder be 0.5–10% of the weight of the gold (or gold plus any other noble metals, if any).

DETAILED DESCRIPTION OF THE INVENTION

The compositions of the present invention and their process of use by screen printing are readily compatible with commonly employed thick-film techniques and systems used for fabricating electronic circuits. The compositions of the invention due to the uniform dispersion and suspension of constituents may be prepared and packaged as paste, suitable for screen printing; this obviates the requirement that the circuit manufacturer become involved with the mixing of photoresist solutions, the dispersion of the inorganic particulate material in the resist composition, and complex coating of the composition on substrates. Additionally, screen printing the compositions permits application on selected areas of substrate, thus substantially reducing the waste and increasing yields. This can be very important where the inorganic particulate material is a valuable noble metal such as gold. In combination with the other constituents the solvents provide a novel paste composition having the proper rheology for screen printing. Screen printing the photopolymerizable paste composition produces the smooth coatings required for fabricating thin multilayer electronic circuit elements, and eliminates the necessity of coating an entire substrate. The photopolymerizable paste composition may contain a high loading of particulate material, e.g., up to about 90% by weight of the composition, providing the required functionality of patterns or layers as conductive elements in electronic circuits on firing. Additionally, the photopolymerizable paste may be photoimaged to produce high resolution, fine line paths, e.g., as fine as 1 mil and finer. If required more than one inorganic phase or layer may be successively applied and imaged while substantially maintaining the high resolution required.

The photopolymerizable composition of this invention is specifically formulated as a paste. A paste may generally be defined as a soft plastic mixture or composition and may be specifically defined for the purpose of the invention as being semi-fluid and having sufficient fluidity to permit screen-printing and sufficient vicosity to substantially retain its form on application to a substrate. Paste compositions of this invention will have a viscosity in the range of about 5,000 to 1,000,000 centipoise as measured by a Brookfield viscometer at the application temperature, e.g., 23°C., and will preferably have a viscosity in the range 10,000 to 100,000 centipoise.

The inorganic particulate constituent of the paste composition includes gold and an inorganic binder therefor, in a finely divided state, to form, on firing, an adherent sintered or fused film on a suitable substrate. In order to obtain the high resolution desired by photoimaging patterns or layers of the paste composition, the largest dimension of the majority of the finely divided particulate material should not exceed the desired line or pattern length or width, and preferably the particle size will remain below about 20% of the resolution of the line or pattern length or width desired, e.g., for one-mil lines, particle size should be less than 5 microns. Further, when the desired line resolution exceeds the desired resolution of the spacing between lines, the maximum particle size should be less than about 20% of the spacing between lines. Spherical shaped particles are the preferred form of the finely divided particulate matter. The gold is preferably spherical particles 0.1 to 5 microns in diameter.

The inorganic binder is present to promote adhesion of the gold to the substrate on firing. The chemical nature of the inorganic binder is not critical; the binder is selected according to principles well known in the art dependent upon the final properties desired. Glassy (vitreous) and/or ceramic (crystalline) materials may be employed. Thus, typical glasses may be used, as may nonglassy oxides such as copper oxide, cadmium oxide, vanadium oxide, bismuth oxide, etc., mixtures of any of these, etc.

The solvent, which is used as a vehicle for the other constituents of the photopolymerizable paste composition of the invention, must readily dissolve or suspend all the constituents including the inorganic solids. The solvent must be inert towards the constituents of the paste composition. Additionally, the solvent should be substantially removed from the paste composition by drying prior to photoimaging. Remaining solvent will cause the layer to be soft and adhere to the mask during exposure, any may also interfere with the photopolymerization process. Further, the solvent should be free of resinous high boiling components that would not be readily removable by drying, and which would prevent the thorough removal of the particulate material in the unimaged areas with the development solvent. The unpolymerized areas of monomer, polymeric binder and inorganic solids must be readily removable with suitable development solvents. The paste solvent herein is dihydroterpineol, benzyl alcohol, tetralin, or mixtures thereof.

The photopolymerizable monomeric constituent of the composition is di-, tri-, or tetra-ethyleneglycoldiacrylate or mixtures thereof.

The sensitizer or photoinitiator constituent of the paste compositions may be selected from the well-known class of organic sensitizers including, but not limited to, tertiary-butyl anthraquinone, benzoin methyl ether, 9,10-anthraquinone, 1-chloroanthraquinone, 2-chloroanthraquinone, 2-methylanthraquinone, 2-ethylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2,3-diphenylanthraquinone, sodium salt of anthraquinone alphasulfonic acid, 2-chloro-2-methylanthraquinone alphasulfonic acid, 3-chloro-2-methylanthraquinone alphasulfonic acid, 3-chloro-2-anthraquinone, retenequinone, 7,8,9,10-tetrahydronaphthacenequinone, and 1,2,3,4-tetrahydrobenz(a)anthracene-7,12-dione, and mixtures thereof.

Suitable polymeric binders for use in the paste composition are polymethylmethacrylates, polyethylmethacrylates, and mixtures thereof, having inherent viscosities in the range of 0.15 to 0.95 in chloroform at 25°C., preferably 0.15 to 0.5. Inherent viscosity is measured by the method described in *Condensation Polymers; By Interfacial and Solution Methods*, P. W. Morgan, Interscience Publishers, New York (1965), Appendix B, at 465, using chloroform as the solvent at 25°C. Neither compositions with polymers having inherent viscosities above this range, nor compositions using as the principal polymer a material other than those indicated above (such as polyisobutylmethacrylate), produce the line resolution available with the compositions of the present invention under similar conditions.

The polymers used in the Examples were usually precipitated from acetone with methanol/water, and pressed at 100°C. in a Carver press, then dried in a vacuum oven.

Optional in the compositions of the present invention, and preferred with thick prints, are organometallic compounds of Hf, Zr, Ti and/or P. The term organometallic as applied to metals is understood in the art to refer to compounds of the named metal in which the metal atom is attached to a sulfur or oxygen atom, which is in turn linked to a carbon atom. Thus, esters and resinates are comprehended. See, for example, R. T. Hopper, *Ceramic Industry*, June, 1963. Included among the resinates are the pinene mercaptans. Commercially available resinates useful in this invention include Du Pont Tyzor titanium resinates, Engelhard titanium resinates, Tetramethyltitanate
Tetra-2-ethylhexyltitanate
Tetraethyltitanate
Tetrakis-di-1,6-t-Bu-phenyltitanate
Tetrakis-di-1,6-t-Bu-phenylzirconate
Tetrabenzyltitanate
Tetra-n-propyltitanate and
Triallylphosphite
Triphenylphosphite The organometallics are especially useful in this invention when relatively thick layers of the gold composition are to be printed, e.g., unfired thicknesses in the range 0.35 to 0.7 mils (about 8–17 microns) in order to prevent peeling or delamination of the developed image on firing. When thinner layers of the gold composition are printed, organometallics are not necessary.

The gold and inorganic binder powders are the materials of which the fired pattern is composed. The polymer holds those powders in suspension during the coating, photoimaging, development and initial firing steps. Monomers and accompanying initiator provide polymerization on exposure to light, which renders the exposed areas relatively insoluble in the developer spray, whereas in the unexposed areas the polymer is nore readily soluble in spray.

Optional ingredients may be included in the paste composition to improve adhesion, alter viscosity, modify rheological properties, aid in the dispersion of the inorganic solids or improve the efficiency of the development process, e.g., silanes, ionic and nonionic surfactants, soya lecithin are typical of such optional ingredients. Also optional are thinners and thickeners, the latter including ethyl cellulose and high molecular weight polyisobutylmethacrylate.

There are normally 15–45 parts polymer (a) to 55–85 solvent (b), preferably 20–35 parts (a) to 65–80 parts (b). The weight of monomer (c) is 3–20%, preferably 4–16% of the total weight of (a) plus (b).

The amount of photoinitiator is an amount effective to initiate polymerization of monomer (c) under the conditions used, as known to those skilled in the art. Normally, the weight of initiator (d) is 5–50% of the weight of monomer (c).

The organometallic compound is best expressed as the weight ratio of metal therein to the weight of initiator (d); the ratio is in the range 1/10 to 1/2.5, preferably 1/8.3 to 1/4.

The ratio of inorganics (gold and binder powders) to vehicle is selected dependent upon performance characteristics desired, but the vehicle is normally 10–30%, preferably 15–25%, of the total weight of vehicle plus gold and inorganic binder. The inorganic binder is preferably 0.5–10 of the weight of the gold, it being understood that at higher levels of inorganic binder bondability is reduced.

The photopolymerizable paste compositions of the invention may be formulated by dissolving or suspending polymeric binder, monomer and sensitizer in the solvent, mixing in the finely divided inorganic particulate material and milling the composition to a paste on a three-roll mill, such as an ointment mill. The photopolymerizable paste composition may be forced through a fine screen to remove undispersed particles. Photopolymerizable paste compositions so prepared may be packaged in a tube or jar, which is opague to actinic radiation. The packaged compositions are provided to electronic circuit fabricators ready for use in screen printing machines. The paste compositions eliminate the mixing of photoresist solutions and dispersion of inorganic particulate by the circuits manufacturer. Additionally, the paste compositions as before stated are compatible with screen-printing techniques which are well known in the art. They eliminate the necessity for roll or spin coating by the circuit manufacturer of the substrate on which high resolution pattern or layers of conductive or dielectric material are to be photoimaged.

The photopolymerizable paste compositions of the invention may be applied to any suitable substrate, e.g., alumina, glass, barium titanate, sapphire, beryllia, steatite, forsterite, zircon, ferrites, and ferroelectric or semiconductor substrates, e.g., silicon or germanium, or temperature resistant plastics, e.g., polyimides or polysulfones.

The polymerizable paste composition of this invention may be applied to a substrate by screen printing or stencilling either over the entire area of the substrate or on a selected area of the substrate, only slightly larger than the desired high resolution pattern or layer is to occupy. The printed pattern is then dried at a moderate temperature, e.g., below 100°C., especially at 40°–75°C., to evaporate solvent without significant loss of the other liquid constituents of the paste composition. The substrate having the desired pattern of the dried paste composition may then be placed in a vacuum frame. A mask or transparency bearing the high resolution pattern desired thereon, may be placed over the substrate. The subsequent application of a vacuum removes the surrounding atmosphere oxygen and tends to reduce the concentration of polymerization inhibiting oxygen dissolved in the paste composition and provides intimate contact bwtween the screen printed pattern and the mask. The applied vacuum should not exceed 100 torr and preferably will be in the range of 1 to 10 torr. The photopolymerizable compositions may then be imagewise exposed through the mask to actinic radiation for a sufficient period of time to cause photopolymerization of the exposed areas.

As an alternative to exposure in a vacuum, an oxygen-free nitrogen atmosphere may be used. The substrate bearing the desired pattern of the dried paste composition may be placed in an enclosure designed to accurately align the substrate with a high resolution photo mask. The enclosure is then flushed with high purity nitrogen (less than 1000 ppm oxygen) to remove the atmospheric oxygen, which inhibits the photopolymerization that is to take place during exposure. The concentration of oxygen inside the enclosure during exposure is preferably less than 2,000 ppm. The substrate may be exposed either in contact with the photographic mask, or with a collimated light source at a separation of up to 50 mils, and preferably at a separation of 5–25 mils. When the substrate is properly aligned and a suitable oxygen-free atmosphere is obtained in the enclosure, the substrate is exposed through the mask to actinic radiation for a sufficient period of time to cause photopolymerization of the exposed areas. The substrate having the desired photopolymerized image is then removed from the exposure enclosure and developed.

The substrate, having the exposed photopolymerizable composition thereon, may be developed with a suitable solvent to remove monomer, binder and inorganic particulate in the unexposed areas of the composition.

Suitable sources of actinic radiation for photopolymerization composition are generally in the UV range such as wavelengths of about 3,500 Angstroms, e.g., low, medium or high pressure mercury lamps, carbon arcs, xenon arcs, and xenon flash tubes. The substrate, having the exposed photopolymerizable composition thereon, may be developed with a spray of developing solvent from a pressure nozzle or a spray gun, such as is used to spray paint or lacquer.

Suitable solvents for removing the unexposed areas include carbon tetrachloride, chloroform, isobutyl alcohol, trichloroethylene, perchloroethylene, and chlorinated fluorocarbons.

The photopolymerized high resolution pattern is heated or fired to burn or decompose the photopolymerized monomers and polymeric binder and to fuse the inorganic particulate matter to form a functional element on the substrate. Typically, the temperature of the substrate is brought from room to peak firing temperature (400°C. or more) in about 5 to 45 minutes. The peak temperature is maintained for a few minutes and the substrate is gradually returned to room temperature.

EXAMPLES

This invention is illustrated by the following examples and comparative showings. Example 1 illustrates the advantages of polyethylmethacrylate over polymers not of this invention. Examples 2–6 illustrate polyethylmethacrylate polymers with various modifiers and solvents. Examples 7–9 show the use of organometallic compounds to control the problem of substrate delamination by thick conductor patterns during firing. In the examples and showing, as elsewhere in the specification and claims, all parts, percentages and ratios are by weight, unless otherwise stated. The same mixture of monomers used throughout the examples; a 3/2 mixture of diethyleneglycoldiacrylate and tetraethyleneglycoldiacrylate. The same binder was used in all but Example 10, a 45/55 mixture of a glass (59.6% CdO, 7.3% $Na_2O$, 16.5% $B_2O_3$, 2.3% $Al_2O_3$, 14.3% $SiO_2$) and bismuth trioxide.

Example 1

A gold powder with spherical particles ranging in size from 0.4–4 microns was dispersed in a mixture of solvent, inorganic and polymeric binders, monomer and sensitizer by passing over a three-roll mill until dispersed. Composition A is an example of this invention; Composition B is a comparative showing not of the present invention.

The photoinitiator was benzoin methyl ether (BME), for A as a 50% weight solution in dihydroterpineol (DHT) and for B as a 33% solution in tetralin (Tet). The polymer in Composition A was a 40% solution in Tet of low molecular weight polyethylmethacrylate with inherent viscosity of 0.2 in chloroform at 25°C.; the polymer in Composition B was a 20% solution in DHT of very high molecular weight polyisobutyl methacrylate (inherent viscosity of 1.1 in chloroform at 25°C.). Compositions are as set forth in Table I.

TABLE I

| COMPONENT | EXAMPLE 1 COMPOSITION A | COMPOSITION B |
|---|---|---|
| Gold | 75.0 | 74 |
| Inorganic Binder | 3.0 | 3.1 |
| Polymer solution | 20.0 | 20.7 |
| polymer | (8.0) | (4.1) |
| solvent | (12.0) | (16.7) |
| Monomers | 1.4 | 1.5 |
| Initiator solution | 0.6 | 0.5 |
| initiator | (0.2) | (0.25) |
| solvent | (0.4) | (0.25) |
| Total solvent | 12.4 | 16.9 |
| Silane dispersing agent | — | 0.1 |

The compositions were screen printed to cover the area in which the pattern was to be generated, using a 230-mesh nylon screen. Coatings were dried at 50°–60°C. for 15–20 min. The weight of the dried coating was 40–50 mg./in.$^2$. Substrates then were exposed for 30–45 seconds through a photographic mask bearing an image of the conductor pattern to be generated, exposing with a collimated light beam from a mercury lamp. During exposure, the coated substrate was kept under a nitrogen blanket to exlude oxygen, which inhibits the reaction occurring during exposure. Sample A was developed (the unexposed portion was removed) by a perchloroethylene spray from a hand spray gun driven by 100 psi air pressure. Distance of gun from substrate was 6 inches; development time was 4–6 seconds. The developed pattern was dried with a jet of compressed air. Substrates were fired in a 3-zone moving belt furnace, spending 5 minutes residence in each zone (450°C., 650°C. and 850°C.) with 5 more minutes for cooldown.

In the samples produced using Composition A of this invention the fired thickness was typically 0.15–0.20 mils. Sheet resistivity was 10–15 milliohms per square at this thickness. Fired gold films were readily bonded to gold wire by thermal compression. Resolution of 1-mil wide lines on 4-mil centers (the centers of each of two parallel lines were 4 mils apart) was readily and cleanly achieved.

In the case of comparative Composition B development with high pressure spray (100 psi) completely washed the exposed pattern off the substrate. When a low pressure (less than 10 psi) perchloroethylene spray propelled by gas from an aerosol can was used, 1-mil lines on 4-mil centers could not be cleanly resolved without breaks occurring in the lines, resulting in useless structures. Two-mil lines on 5-mil centers were not reproduced as will with Composition B as well as Composition A; more undeveloped material remained between the conductor lines when Composition B was used than when Composition A was used. Occasional breaks were seen even with 2-mil lines of Composition B.

EXAMPLE 2

A composition similar to Composition A of Example 1 was prepared, except the polymer solution was a 20% solution of very high molecular (I.V. 0.9 in chloroform at 25°C.) weight polyethylmethacrylate in tetralin.

BME initiator was added as a 33% solution in tetralin. Composition in parts by weight is as follows:

| | |
|---|---|
| Gold | 74 |
| Inorganic Binder | 2.6 |
| Polymer solution | 20.8 |
| polymer | (4.2) |
| solvent | (16.6) |
| Monomers | 1.5 |
| Initiator solution | 0.7 |
| initiator | (0.2) |
| solvent | (0.5) |
| Total solvent | 17.1 |

This composition was processed similarly to Example 1A, except that the spray gun was held about 3 inches from the substrate during development. The fired products had appearance, resistivity, thickness and resolution similar to those observed with Composition A of Example 1.

EXAMPLE 3

Compositions were prepared as in Example 1A, except the polymer solution was a 40% solution in dihydroterpineol of a low molecular weight polyethylmethacrylate (I.V. 0.2 in chloroform at 25°C.). BME initiator was added as a 50% solution in DHT. The composition in weight was:

| | |
|---|---|
| Gold | 74 |
| Inorganic Binder | 2.6 |
| Polymer solution | 20.8 |
| polymer | (8.3) |
| solvent | (12.5) |
| Monomers | 1.5 |
| Initiator solution | 0.5 |
| initiator | (0.25) |
| solvent | (0.25) |
| Total solvent | 12.8 |

Processing conditions were the same as Example 1A. Resolution, resistivity and other properties of fired circuits made with this composition were similar to the results obtained in Example 1A.

EXAMPLE 4

The composition was the same as that of Example 3, except the polymer solution was 40 parts of a low molecular weight polyethylmethacrylate (I.V. 0.2 in chloroform at 25°C.) in 60 parts benzyl alcohol. Processing conditions were the same as Example 1A. Resolution, resistivity and bondability were similar to the results obtained with Example 1A.

EXAMPLE 5

Compositions were prepared as in Example 3, except the polymer solution was 25.5 parts of low molecular weight polyethylmethacrylate (I.V. 0.2 in chloroform at 25°C.) and 0.75 part high molecular weight ethyl cellulose in 74 parts DHT. The composition was as follows:

| | |
|---|---|
| Gold | 74 |
| Inorganic Binder | 2.6 |
| Polymer solution | 21 |
| polymer | (5.4) |
| solvent | (15.5) |
| Et cellulose | (0.2) |
| Monomer | 1.5 |
| Initiator solution | 0.5 |
| initiator | (0.25) |
| solvent | (0.25) |
| Total solvent | 15.8 |

The ethyl cellulose provided better pattern levelling after screen printing of the substrates. Processing conditions and fired conductor pattern characteristics (resolution, resistivity, bondability) were similar to those in Example 1A.

EXAMPLE 6

A composition was prepared as in Example 3, except that the polymer solution consisted of 25.5 parts of low molecular weight polyethylmethacrylate (I.V. 0.2 in chloroform at 25°C.) plus 3 parts very high molecular weight polyisobutylmethacrylate (inherent viscosity 1.1 at 25°C. in chloroform) in 71 parts DHT. The purpose of the polyisobutylmethacrylate was to improve levelling after screen printing. Composition is as follows in parts by weight:

| | |
|---|---|
| Gold | 74 |
| Inorganic Binder | 2.6 |
| Polymer solution | 21 |
| polymer | (5.4) |
| solvent | (14.9) |
| PBMA | (0.6) |
| Monomers | 1.5 |
| Initiator solution | 0.5 |
| initiator | (0.25) |
| solvent | (0.25) |
| Total solvent | 15.1 |

Processing, resolution obtained, fired resistivity, and other properties of fired circuits are similar to those in Example 1A.

EXAMPLE 7

This illustrates the effect of addition of an organometallic titanium compound on adhesive of developed patterns during the firing process, where the fired patterns are about twice as thick as those of Example 1A. Two typical compositions of this invention were formulated, one with no titanium resinate (A), the other with about 1% Engelhard titanium resinate (B), based on the total composition weight. The ratio of the weight of the Ti to weight of initiator was 1/5. The compositions were prepared as in Example 1. The polymer solution was 25.5 parts low molecular weight polyethylmethacrylate (I.V. 0.2 in chloroform at 25°C.) plus 3 parts very high molecular weight polyisobutylmethacrylate (I.V. 1.1 in chloroform at 25°C.) in 71 parts DHT. Compositions were as follows, where TBAQ is tertiary-butylanthraquinone:

| | A | B |
|---|---|---|
| Gold | 78.1 | 77.3 |
| Inorganic Binder | 4.6 | 4.6 |
| Polymer Solution | 15.6 | 15.5 |
| polymer | (3.9) | (3.9) |
| solvent | (11.2) | (11.2) |
| PBMA | (0.5) | (0.5) |
| Monomers | 1.3 | 1.3 |
| Initiator (TBAQ) | 0.37 | 0.37 |
| Titanium Resinate | 0 | 0.98 |

Substrates were printed through an 83-mesh nylon screen Substrates were printed through an 83-mesh nylon screen and dried 45 min. at 55°C. Coated substrates were exposed through a mask to a U.V. lamp as in Example 1, but for 60 seconds, under nitrogen and developed with a hand spray gun (100 psi) using tetrachloroethylene solvent. Substrates thus developed were then fired as in Example 1. Substrates with Composition A showed extensive, catastrophic delamination of sintered gold at pattern edges, while substrates coated with Composition B showed no delamination. Fired thickness was about 0.4 mils; fired resistivity was 3.0–3.5 milliohms per square at this thickness.

EXAMPLE 8

Various other organometallic compounds were used and prevented the fired film delamination observed with thick films in Example 7A. The procedure and composition was that of Example 7A, except that proportions varied as indicated below and the following organometallic compounds were added to each of a series of compositions:

Tetramethyltitanate
Tetra-2-ethylhexyltitanate
Tetraethyltitanate
Tetrakis-di-1,6-t-Bu-phenyltitanate
Tetrakis-di-1,6-t-Bu-phenylzirconate
Tetrabenzyltitanate
Tetra-n-propyltitanate
Triallylphosphite
Triphenzlphosphite The general composition in parts by weight was:

| | |
|---|---|
| Gold | 76.9 |
| Inorganic Binder | 4.7 |
| Polymer solution of Example 7A | 16.1 |
| Monomers | 1.2 |
| Initiator (TBAQ) | 0.3 |
| Organometallic | 1.0 |

The weight ratio of metal in organometallic to photoinitiator in these experiments was in the range 1/10 to 1/2.5. These compounds were coated with a 149-mesh nylon screen and dried; they were then exposed, developed, and fired as in Example 1A. Fired thickness was about 0.35 mil; resistivity was about 5 milliohms per square at this thickness.

Similar compositions without organometallic showed delamination when substrates coated with a 149-mesh nylon screen were similarly exposed, developed, and fired.

EXAMPLE 9

The following composition was prepared as in Example 1A using the polymer solution of Example 7B.

| | |
|---|---|
| Gold | 77 |
| Inorganic Binder | 4.6 |
| Polymer solution of Example 7B | 15.5 |
| Monomers | 1.4 |
| Initiator (TBAQ) | 0.37 |
| Titanium Resinate (Engelhard) | 0.93 |

Several samples were printed on substrates with 149-, 137- and 130-mesh nylon screens, respectively, and dried for 1 hour at 55°C. Processing was similar to Example 1A. Resolution of 2 mils wide lines on 5 mil centers was easily obtained. This material yielded, respectively 6–7 milliohms per square and 0.33–0.35 mil fired thickness (149 mesh); 5–6 milliohms per square and 0.35–0.4 mil fired thickness (137 mesh); and 4–5 milliohms per square and 0.40 mil fired thickness (130 mesh). No substrate delamination was observed. Results outside the above ranges were obtained when variable printing conditions, development conditions, or firing conditions were used.

EXAMPLE 10

A composition was made with a glassless binder such as that of Smith German OS No. 2,311,392 (published Sept. 13, 1973), of a 3/1 powder mixture of $Cu_2O$/CdO. The composition is otherwise similar to that of Example 9:

| | |
|---|---|
| Gold | 80.6 |
| Inorganic Binder | 1.0 |
| Polymer solution of Ex. 7B | 16.1 |
| Monomers | 1.4 |
| TBAQ | 0.40 |
| Titanium Resinate (Engelhard) | 0.5 |

The weight ratio of Ti to initiator was 1/10. The material was printed with a 130-mesh nylon screen, dried 45 minutes at 55°C., developed as in Example 1A, but with 60 seconds exposure, and fired in a box furnace for 10 minutes at 1,000°C. Fired thickness was 0.25–0.30 mil, and resistivity was 4–5 milliohms per square. Resolution of 2 mil wide lines on 5 mil centers was easily obtained. No substrate delamination was observed in the fired patterns.

I claim:

1. A gold conductor composition comprising finely divided gold and an inorganic binder therefor dispersed in a photosensitive vehicle, said vehicle comprising, by weight a. 15–45 parts of a polymer having an inherent viscosity, in chloroform at 25°C., in the range of 0.15 to 0.95, said polymer being selected from the class consisting of polymethylmethacrylate, polyethylmethacrylate, and mixtures thereof, b. 55–85 parts of a solvent for polymer (a), said solvent being selected from the class consisting of dihydroterpineol, benzyl alcohol, tetralin, and mixtures thereof, c. a monomer selected from the class consisting of di-, tri-, and tetra-ethyleneglycoldiacrylate and mixtures thereof, the weight of monomer (c) being 3–20% of the total weight of polymer (a) plus solvent (b), d. a photoinitiator for monomer (c) in an amount effective to initiate polymerization thereof.

2. A gold composition according to claim 1 wherein said photosensitive vehicle additionally comprises (e) an organometallic compound of a metal selected from the class consisting of Hf, Zr, Ti, P or mixtures thereof.

3. A gold composition according to claim 2 wherein the amount of (e) is such that the weight ratio of metal in organometallic compound (e) to photoinitiator (d) is in the range of 1/10 to 1/2.5.

4. Gold compositions according to claim 1 wherein solvent (b) is dihydroterpineol, benzyl alcohol, or a mixture thereof, said vehicle additionally comprising 1-12 parts of polymeric rheology modifier selected from the class consisting of ethylcellulose and polybutylmethacrylate.

5. Gold compositions according to claim 2 wherein solvent (b) is dihydroterpineol, benzyl alcohol, or a mixture thereof, said vehicle additionally comprising 1–12 parts of polymeric rheology modifier selected from the class consisting of ethylcellulose and polybutylmethacrylate.

6. Gold compositions according to claim 1 wherein the vehicle comprises 20–35 parts polymer (a), 65–80 parts solvent (b) and an amount of monomer (c) equal to 4–16% of the total weight of polymer (a) plus solvent (b).

7. Gold compositions according to claim 2 wherein the vehicle comprises 20–35 parts polymer (a), 65–80 parts solvent (b) and an amount of monomer (c) equal to 4–16% of the total weight of polymer (a) plus solvent (b).

8. A gold composition according to claim 1 wherein polymer (a) has an inherent viscosity, in chloroform at 25°C., in the range 0.15 to 0.5.

9. A gold composition according to claim 2 wherein polymer (a) has an inherent viscosity, in chloroform at 25°C., in the range 0.15 to 0.5.

10. A gold composition according to claim 6 wherein polymer (a) has an inherent viscosity, in chloroform at 25°C., in the range 0.15 to 0.5.

11. A gold composition according to claim 7 wherein polymer (a) has an inherent viscosity, in chloroform at 25°C., in the range 0.15 to 0.5.

12. A gold composition according to claim 1 wherein the weight of photoinitiator (d) is about 5–50% of the weight of monomer (c).

13. A gold composition according to claim 2 wherein (e) is an organometallic compound of hafnium.

14. A gold composition according to claim 2 wherein (e) is an organometallic compound of zirconium.

15. A gold composition according to claim 2 wherein (e) is an organometallic compound of titanium.

16. A gold composition according to claim 2 wherein (e) is an organometallic compound of phosphorus.

17. A gold composition according to claim 3 wherein (e) is an organometallic compound of hafnium.

18. A gold composition according to claim 3 wherein (e) is an organometallic compound of zirconium.

19. A gold composition according to claim 3 wherein (e) is an organometallic compound of titanium.

20. A gold composition according to claim 3 wherein (e) is an organometallic compound of phosphorus.

21. A gold composition according to claim 1 wherein the weight of gold plus inorganic binder comprises 70–90% of the composition and the photosensitive vehicle 10–30% thereof.

22. A gold composition according to claim 2 wherein the weight of gold plus inorganic binder comprises 70–90% of the composition and the photosensitive vehicle 10–30% thereof.

23. A gold composition according to claim 21 wherein the gold plus inorganic binder comprises 75–85% and the vehicle 15–25%.

24. A gold composition according to claim 22 wherein the gold plus inorganic binder comprises 75–85% and the vehicle 15–25%.

25. A gold composition according to claim 1 wherein the inorganic binder is 0.5–10% of the weight of the gold.

26. A gold composition according to claim 2 wherein the inorganic binder is 0.5–10% of the weight of the gold.

27. A gold composition according to claim 23 wherein the inorganic binder is 0.5–10% of the weight of the gold.

28. A gold composition according to claim 24 wherein the inorganic binder is 0.5–10% of the weight of the gold.

29. A gold composition according to claim 3 wherein the amount of (e) is such that the weight ratio of metal in (e) to the weight of photoinitiator (d) is in the range 1/8.3 to 1/4.

30. A gold composition according to claim 7 wherein the amount of (e) is such that the weight ratio of metal in (e) to the weight of photoinitiator (d) is in the range 1/8.3 to 1/4.

31. A gold composition according to claim 9 wherein the amount of (e) is such that the weight ratio of metal in (e) to the weight of photoinitiator (d) is in the range 1/8.3 to 1/4.

32. A gold composition according to claim 22 wherein the amount of (e) is such that the weight ratio of metal in (e) to the weight of photoinitiator (d) is in the range 1/8.3 to 1/4.

* * * * *